United States Patent
Shimizu et al.

(10) Patent No.: US 10,334,767 B2
(45) Date of Patent: Jun. 25, 2019

(54) SHIELDING STRUCTURE AND SHIELDING BRAIDED MEMBER

(71) Applicants: AutoNetworks Technologies, Ltd., Yokkaichi, Mie (JP); Sumitomo Wiring Systems, Ltd., Yokkaichi, Mie (JP); SUMITOMO ELECTRIC INDUSTRIES, LTD., Osaka-shi, Osaka (JP)

(72) Inventors: Takeshi Shimizu, Mie (JP); Masaharu Suetani, Mie (JP); Tomoya Kawaguchi, Mie (JP)

(73) Assignees: AutoNetworks Technologies, Ltd., Yokkaichi, Mie (JP); Sumitomo Wiring Systems, Ltd., Yokkaichi, Mie (JP); Sumitomo Electric Industries, Ltd., Osaka-Shi (JP)

( * ) Notice: Subject to any disclaimer, the term of this patent is extended or adjusted under 35 U.S.C. 154(b) by 0 days.

(21) Appl. No.: 15/741,358

(22) PCT Filed: Jun. 29, 2016

(86) PCT No.: PCT/JP2016/069199
§ 371 (c)(1),
(2) Date: Jan. 2, 2018

(87) PCT Pub. No.: WO2017/010283
PCT Pub. Date: Jan. 19, 2017

(65) Prior Publication Data
US 2019/0029149 A1 Jan. 24, 2019

(30) Foreign Application Priority Data
Jul. 10, 2015 (JP) .................. 2015-138628

(51) Int. Cl.
*H01B 7/22* (2006.01)
*H01R 9/03* (2006.01)
(Continued)

(52) U.S. Cl.
CPC ....... *H05K 9/0098* (2013.01); *B60R 16/0215* (2013.01); *H01B 7/228* (2013.01);
(Continued)

(58) Field of Classification Search
None
See application file for complete search history.

(56) References Cited

U.S. PATENT DOCUMENTS 5,267,878 A * 12/1993 Shinji ................... H01R 9/032
439/607.5
5,791,939 A * 8/1998 Tanigawa ............ H01R 9/0518
439/607.01
(Continued)

FOREIGN PATENT DOCUMENTS

JP 2003-110277 A 4/2003
JP 2013-258861 A 12/2013

OTHER PUBLICATIONS

Search Report for PCT/JP2016/069199, dated Sep. 20, 2016.

*Primary Examiner* — Dimary S Lopez Cruz
*Assistant Examiner* — Muhammed Azam
(74) *Attorney, Agent, or Firm* — Honigman LLP

(57) ABSTRACT

A shielding structure includes a shielding braided member that is a braided member obtained by braiding a plurality of resin wires and a plurality of conductive metal wires together and arranged to achieve shielding of an electric wire, a shell that is connected to one end of the shielding braided member; and a crimp fixing portion with which the one end of the shielding braided member is crimped and fixed to the shell such that electric conduction is established.

(Continued)

The shielding braided member includes a metal braided portion that contains no resin wires and that is formed by braiding the plurality of metal wires, and the metal braided portion in the shielding braided member is crimped and fixed to the shell with a crimp ring of the crimp fixing portion.

11 Claims, 3 Drawing Sheets

(51) Int. Cl.
    *H02G 3/04*         (2006.01)
    *H02G 3/06*         (2006.01)
    *H05K 9/00*         (2006.01)
    *B60R 16/02*        (2006.01)
    *H01R 13/6592*    (2011.01)

(52) U.S. Cl.
    CPC ......... *H01R 9/032* (2013.01); *H01R 13/6592* (2013.01); *H02G 3/04* (2013.01); *H02G 3/0691* (2013.01)

(56) References Cited

U.S. PATENT DOCUMENTS

| | | | | |
|---|---|---|---|---|
| 6,781,059 B2* | 8/2004 | Mizutani | ............... | H01R 9/032 174/75 C |
| 8,460,015 B2* | 6/2013 | Deno | ................... | H01R 9/0518 174/78 |
| 8,602,797 B2* | 12/2013 | Omae | ............... | H01R 13/6592 439/99 |
| 8,895,875 B2* | 11/2014 | Kato | ................... | H02G 3/0462 174/359 |
| 8,946,553 B2* | 2/2015 | Kawase | ............... | H01R 9/0509 174/74 R |
| 9,318,849 B2* | 4/2016 | Kobayashi | ......... | H01R 13/5205 |
| 9,676,348 B2* | 6/2017 | Sugino | ............... | B60R 16/0215 |
| 2002/0102872 A1* | 8/2002 | Kanagawa | ........... | H01R 9/0524 439/98 |
| 2005/0199308 A1* | 9/2005 | Swails | ................... | F16L 11/088 138/109 |
| 2009/0126985 A1* | 5/2009 | Aoki | ..................... | H02G 3/0683 174/377 |
| 2013/0032393 A1* | 2/2013 | Toyama | .............. | B60R 16/0215 174/72 A |
| 2013/0055882 A1* | 3/2013 | Egres, Jr. | ................. | D04C 1/02 89/36.02 |
| 2013/0316582 A1* | 11/2013 | Imahori | ................... | H01R 4/10 439/607.55 |
| 2014/0179161 A1* | 6/2014 | Imahori | ............. | H01R 13/6592 439/607.45 |
| 2014/0202756 A1* | 7/2014 | Adachi | ............... | B60R 16/0215 174/377 |
| 2014/0202763 A1* | 7/2014 | Adachi | ................ | H01R 13/504 174/72 A |
| 2014/0284100 A1* | 9/2014 | Ichikawa | ........... | B60R 16/0215 174/70 R |
| 2015/0008032 A1* | 1/2015 | Nakai | ................... | H02G 3/0691 174/650 |
| 2015/0008252 A1* | 1/2015 | Nakai | ...................... | B23K 1/06 228/110.1 |
| 2015/0081000 A1* | 3/2015 | Hossainy | ................... | A61F 2/88 623/1.2 |
| 2015/0155638 A1* | 6/2015 | Nagahashi | ............. | H01R 4/203 174/74 R |
| 2015/0187469 A1* | 7/2015 | Inao | ..................... | H02G 3/0481 29/863 |
| 2015/0195961 A1* | 7/2015 | Yanagihara | .......... | H05K 9/0098 174/350 |
| 2015/0289420 A1* | 10/2015 | Imahori | .................. | H01F 17/06 174/350 |
| 2016/0134090 A1* | 5/2016 | Kushima | ............. | H02G 3/0481 174/362 |
| 2017/0231125 A1* | 8/2017 | Urashita | ............. | H01B 7/0216 |
| 2018/0054026 A1* | 2/2018 | Nolting | ............. | H01R 13/6592 |

* cited by examiner

SHIELDING STRUCTURE AND SHIELDING BRAIDED MEMBER

CROSS-REFERENCE TO RELATED APPLICATIONS

This application is the U.S. national stage of PCT/JP2016/069199 filed Jun. 29, 2016, which claims priority of Japanese Patent Application No. JP 2015-138628 filed Jul. 10, 2015.

TECHNICAL FIELD

The present invention relates to a technique for achieving electromagnetic shielding of an electric wire.

BACKGROUND

A braided member may be used for achieving electromagnetic shielding of an electric wire. JP 2012-212657A discloses, as such a braided member, a shielding sleeve obtained by braiding fibers that are plated with metal.

JP 2013-74650A discloses use of a braid obtained by braiding conductive metal wires and wear-resistant resin wires made of a synthetic resin together to secure an electromagnetic shielding function, wear resistance, and impact resistance.

In the case of the braid disclosed in JP 2013-74650A, resin wires and metal wires are used in combination, and therefore, the weight can be reduced. Moreover, JP 2013-74650A states that the braid is welded to a metal shell (conductive member) and thus fixed thereto such that electric conduction is established. In addition, JP 2013-74650A states that the braid is crimped and fixed by a braid fixing means other than welding, such as crimping using a shielded ring or insert molding.

However, when a portion containing the resin wires in the braid is crimped and fixed to the conductive member, the resin wires come into contact with the conductive member, and therefore, it may be difficult to favorably secure conduction between the braid and the conductive member. For example, the occurrence of a high-temperature atmosphere or a temperature cycle in a vehicle may cause thermal creep of the resin wires, resulting in an increase in the contact resistance between the metal wires and the conductive member.

To address this, it is an object of the present invention to provide a technique for favorably secure conduction between a conductive member and a braided member constituted by metal wires and resin wires.

SUMMARY

To solve the foregoing problems, a shielding structure according to a first aspect includes: a shielding braided member that is obtained by braiding a plurality of resin wires and a plurality of conductive metal wires together and is arranged to achieve electromagnetic shielding of an electric wire; a conductive member that is connected to the shielding braided member; and a crimp fixing portion with which a portion of the shielding braided member is crimped and fixed to the conductive member such that electric conduction is established, wherein the shielding braided member includes a metal braided portion that contains no resin wires and that is formed by braiding the plurality of metal wires, and the metal braided portion in the shielding braided member is crimped and fixed to the conductive member using the crimp fixing portion.

A second aspect is the shielding structure according to the first aspect, wherein the crimp fixing portion includes: a first crimp fixing portion with which the metal braided portion in the shielding braided member is fixed to the conductive member; and a second crimp fixing portion with which a mixed braided portion containing the resin wires other than the metal braided portion in the shielding braided member is fixed to the conductive member.

A third aspect is the shielding structure according to the second aspect, wherein the crimp fixing portion is constituted by a single member including the first crimp fixing portion and the second crimp fixing portion.

A fourth aspect is the shielding structure according to the second or third aspect, wherein a crimping force of the first crimp fixing portion is larger than that of the second crimp fixing portion.

A fifth aspect is the shielding structure according to any one of the first to fourth aspects, wherein the metal braided portion is formed at an end of the shielding braided member.

A sixth aspect is the shielding structure according to the fifth aspect, wherein the shielding braided member has a tubular shape and forms an insertion path into which the electric wires are inserted, the conductive member includes a tubular portion that is arranged inside the metal braided portion at the end of the shielding braided member, and the crimp fixing portion includes an annular member with which the metal braided portion at the end of the shielding braided member is crimped and fixed to the tubular portion of the conductive member.

A seventh aspect is a shielding braided member that is formed by braiding a plurality of resin wires and a plurality of conductive metal wires together, and includes a metal braided portion that contains no resin wires and that is formed by braiding the plurality of metal wires together.

Advantageous Effects of Invention

With the shielding structure according to the first aspect, the metal braided portion containing no resin wires in the shielding braided member is crimped to a conductive member, thus making it possible to increase the reliability of the conductive connection between these members.

With the shielding structure according to the second aspect, the mixed braided portion other than the metal braided portion in the shielding braided member is also crimped and fixed to the conductive member, thus making it possible to firmly fix the shielding braided member to the conductive member.

With the shielding structure according to the third aspect, the crimp fixing portion can be made of a single member, thus making it possible to reduce the number of components.

With the shielding structure according to the fourth aspect, the metal braided portion is crimped more strongly than the mixed braided portion other than the metal braided portion is, thus making it possible to further increase the reliability of the conductive connection between the shielding braided member and the conductive member.

With the shielding structure according to the fifth aspect, the position at which the metal braided portion is formed is set to an end of the shielding braided member, thus making it easy to form the metal braided portion.

With the shielding structure according to the sixth aspect, the metal braided portion at an end of the shielding braided member contains no resin wires, thus making it easy to increase the diameter. Therefore, it is easy to sheathe the tubular portion of the conductive member with the end of the shielding braided member.

With the shielding braided member according to the seventh aspect, the metal braided portion containing no resin wires in the shielding braided member is crimped to the conductive member, thus making it possible to increase the reliability of the conductive connection between these members.

DETAILED DESCRIPTION OF PREFERRED EMBODIMENTS

Figure 1:
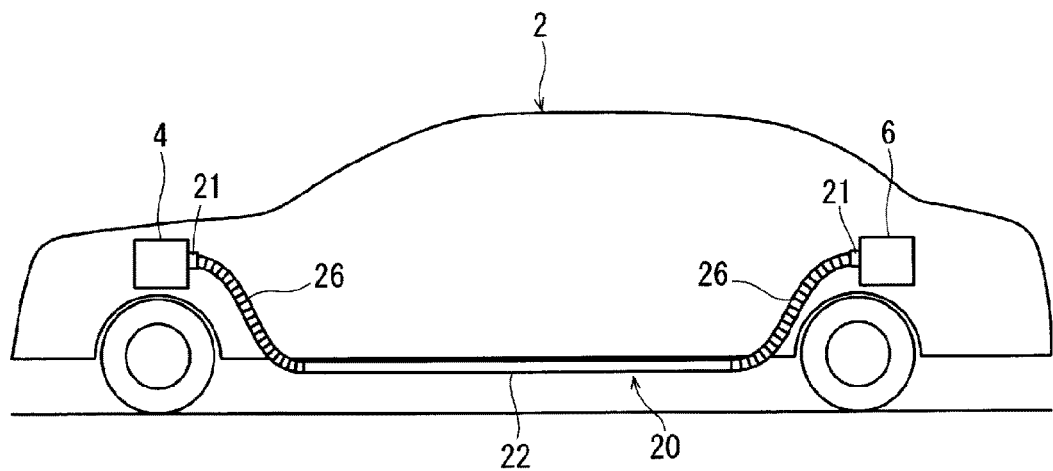
FIG. 1 is a schematic explanatory diagram showing a state in which a wiring module according to a first embodiment is attached to a vehicle.

Hereinafter, embodiments of the present invention will be described with reference to the accompanying drawings. It should be noted that components that are described in the embodiments below are for illustrative purposes only and are not intended to limit the scope of the present invention in any way. Moreover, in the drawings, the dimensions and the numbers of various portions may be exaggerated or simplified as necessary in order to facilitate understanding.

1. First Embodiment

Figure 2:
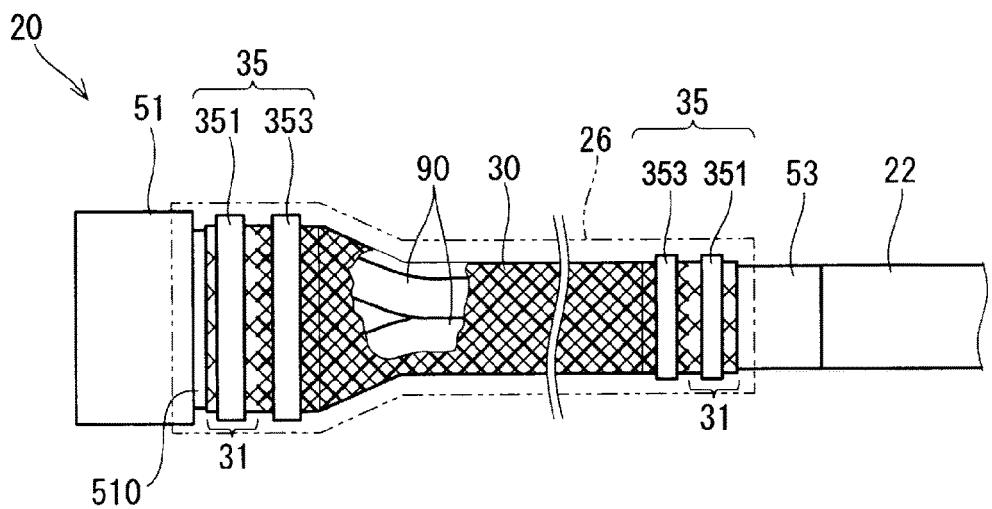
FIG. 2 is a schematic side view showing one end of the wiring module according to the first embodiment.
Figure 3:
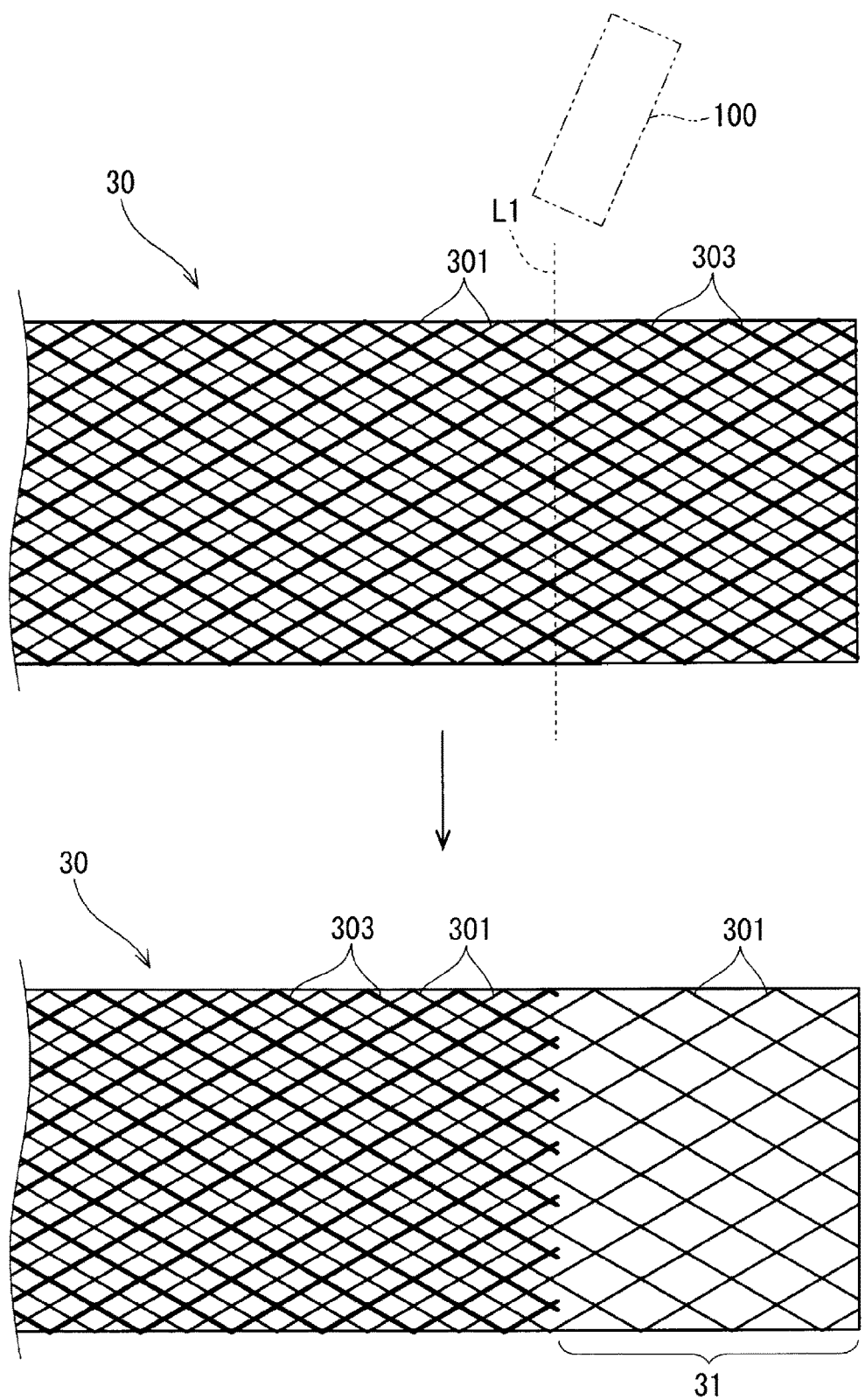
FIG. 3 is an explanatory diagram illustrating how a metal braided portion is formed in a shielding braided member according to the first embodiment.

FIG. 1 is a schematic explanatory diagram showing a state in which a wiring module 20 according to a first embodiment is attached to a vehicle. FIG. 2 is a schematic side view showing one end of the wiring module 20 according to the first embodiment. In FIG. 2, a portion of a shielding braided member 30 is cut away, and its inner structure is shown. FIG. 3 is an explanatory diagram illustrating how a metal braided portion 31 is formed in the shielding braided member 30 according to the first embodiment.

The wiring module 20 may be used as a structure for achieving electromagnetic shielding of electric wires that connect a first electric apparatus 4 and a second electric apparatus 6 that are mounted in a vehicle 2 such as an automobile.

Here, the first electric apparatus 4 is arranged on the front side (e.g., in an engine room) with respect to a compartment of the vehicle 2, and the second electric apparatus 6 is arranged on the rear side (e.g., underneath a trunk) with respect to the compartment of the vehicle 2. For example, one of the first electric apparatus 4 and the second electric apparatus 6 may be a battery, and the other may be an inverter device.

The wiring module 20 is arranged passing underneath the floor of the vehicle 2. It is preferable that the intermediate portion of the wiring module 20 that is fixed underneath the floor extends along the lower surface of the floor and is maintained in a certain shape (e.g., a linear shape). On the other hand, connectors 21 are connected to the ends of the wiring module 20 and also connected to the first electric apparatus 4 and the second electric apparatus 6. Considering that the intermediate portion of the wiring module 20 is fixed to the vehicle 2, and the connectors 21 located at the ends of the wiring module 20 are connected to the first electric apparatus 4 and the second electric apparatus 6 and fixed thereto, it is preferable that the ends of the wiring module 20 are easily bent in order to absorb differences in vibration between the fixation positions. Moreover, it is preferable that the ends of the wiring module 20 are easily bent in order to have these ends face toward the first electric apparatus 4 and the second electric apparatus 6.

To address this, at the intermediate portion of the wiring module 20, a plurality of electric wires 90 are sheathed with a sheathing pipe 22. As a result, the intermediate portion of the wiring module 20 is protected and maintained in a predetermined route shape. The sheathing pipe 22 is made of conductive metal or a conductive resin that has electrical conductivity, or has a multilayer structure in which metal and an insulating resin are layered. The two ends of the wiring module 20 are sheathed with sheathing members 26 such as corrugated tubes that are easily bent. As a result, the ends of the wiring module 20 are protected and easily bent.

As shown in FIG. 2, the wiring module 20 includes a plurality of (here, two) electric wires 90 and shielding braided members 30 in which the plurality of electric wires 90 are accommodated all together. It should be noted that the wiring module 20 does not necessarily include the plurality of electric wires 90, and may also include only a single electric wire 90.

Each of the electric wires 90 is a conductive path that includes a conductor and an insulator (coating) and is formed to have a length required for electric connection. The conductor is made of copper, a copper alloy, or aluminum. A conductor obtained by twisting strands or a rod-shaped conductor having a rectangular or circular cross section (e.g., a flat single-core conductor or a round single-core conductor) may also be used. In this embodiment, the electric wire 90 is configured as a conductive path for high voltage, but may also be configured as a conductive path for low voltage. A busbar may also be used as the electric wire 90.

The plurality of electric wires 90 are sheathed with the shielding braided members 30, and the shielding braided members 30 are arranged to achieve the electromagnetic shielding of the plurality of electric wires 90. In this embodiment, the shielding braided member 30 has a tubular shape and forms an insertion path into which the plurality of electric wires 90 are inserted. The shielding braided member 30 is formed by braiding conductive metal wires 301 and a plurality of resin wires 303 together. Each of the metal wires 301 and resin wires 303 may be constituted by a single rod-shaped strand member or a single linear member obtained by twisting a plurality of strand members, for example.

Metal braided portions 31 obtained by braiding only the plurality of metal wires 301 together without the resin wires 303 are formed at the two ends of the shielding braided member 30. Specifically, a method of forming these metal braided portions 31 is performed as follows. That is, as shown in FIG. 3, a laser beam is emitted from a laser 100 along a cutting line L1, and specific resin wires 303 are cut. Here, the cutting line L1 is a straight line that is set to be located at a position separated from an end of the shielding braided member 30 with a required interval and that is parallel with a cross section orthogonal to the axial direction of the tubular shielding braided member 30. The resin wires 303 cut by the laser beam are pulled out and removed from the end of the shielding braided member 30. As a result, the tubular metal braided portion 31 in which only the metal wires 301 remain is formed. Specifically, in this embodiment, the metal braided portion 31 is constituted by only the metal wires 301 extending from a portion (mixed braided portion) of the shielding braided member 30 in which the resin wires 303 remain.

It should be noted that the metal braided portion 31 is not necessarily formed over the entire circumference of the end of the shielding braided member 30. For example, a metal braided portion containing no resin wires 303 may be formed at a portion of the circumference of the end of the shielding braided member 30 over predetermined lengths in the vertical and horizontal directions. In this case, the metal braided portion may be formed at one position in the circumferential direction, or the metal braided portions may be formed at a plurality of positions in a scattered manner.

The metal braid located at one end of the shielding braided member 30 is connected to a conductive shell 51 (conductive member) such that electric conduction is established. The shell 51 is a component of the connector 21 that is connected to a shielding case of the first electric apparatus 4 or the second electric apparatus 6. The shell 51 is a member made of conductive metal, but may also be a member made of a conductive resin.

Here, the shell 51 includes a tubular portion 510 into which ends of the electric wires 90, such as terminals, can be inserted. The outer circumference of the tubular portion 510 is sheathed with an end of the shielding braided member 30 that includes the metal braided portion 31 (that is, the tubular portion 510 is arranged inside the metal braided portion), and, in this state, the end of the shielding braided member 30 is crimped and fixed thereto using a crimp fixing portion 35. In this embodiment, the crimp fixing portion 35 includes two annular members, namely crimp rings 351 and 353. The crimp ring 351 is attached such that the terminal metal braided portion 31 is crimped therewith, and the crimp ring 353 is fixed such that the mixed braided portion containing no resin wires 303 in the shielding braided member 30 is crimped therewith. The crimp ring 351 is an example of a first crimp fixing portion, and the crimp ring 353 is an example of a second crimp fixing portion.

Crimping and fixing the metal braided portion 31 containing no resin wires 303 in the shielding braided member 30 to the shell 51 in this manner makes it possible to connect the shielding braided member 30 and the shell 51 to each other such that electric conduction is established. In particular, the metal braided portion 31 contains no resin wires 303, and therefore, thermal creep of the resin wires 303 does not occur in the metal braided portion 31. As a result, an increase in the contact resistance between the metal braided portion 31 and the shell 51 can be suppressed. Accordingly, the reliability of the conductive connection between the shielding braided member 30 and the shell 51 can be increased.

Crimping and fixing the mixed braided portion containing the resin wires 303 other than the metal braided portion 31 in the shielding braided member 30 to the tubular portion 510 of the shell 51 using the crimp ring 353, which is the second crimp fixing portion, makes it possible to increase the fixing force of the crimp fixing portion 35. This makes it possible to suppress the dislodgement of the end of the shielding braided member 30 from the shell 51 when tensile force is applied on the shielding braided member 30. It should be noted that the crimp ring 353, which is the second crimp fixing portion, may also be omitted. For example, when the end of the shielding braided member 30 can be sufficiently fixed to the shell 51 using only the crimp ring 351, the crimp ring 353 may be omitted.

It should be noted that it is desirable to increase the crimping force applied to the metal braided portion 31 by crimping the crimp ring 351 more strongly than the crimp ring 353. This makes it possible to further increase the reliability of the conductive connection between the metal braided portion 31 and the shell 51. It should be noted that the metal braided portion 31 contains no resin wires 303, and therefore, the crimping force of the metal braided portion 31 can be easily set to be larger than that of the mixed braided portion without breakage or the like.

A means for crimping and fixing the shielding braided member 30 to the shell 51 is not limited to crimping using the crimp rings 351 and 353. For example, the shielding braided member 30 may also be crimped and fixed to the shell 51 by tightening using a belt-shaped band. Moreover, the end of the shielding braided member 30 may also be crimped and fixed by insert molding of a molding resin using, as insert portions, the shielding braided member 30 and the tubular portion 510 of the shell 51.

The position at which the metal braided portion 31 is formed is set to the end of the shielding braided member 30, and therefore, the resin wires 303 can be removed more easily compared with a case where such a position is set to the intermediate portion on the interior side, thus making it easy to form the metal braided portion 31. Moreover, the metal braided portion 31 contains no resin wires 303, thus making it easy to increase the diameter of the end of the shielding braided member 30. Therefore, even when the external dimensions of the tubular portion 510 of the shell 51 is larger than the width of the opening of the shielding braided member 30 whose diameter is not increased, the shielding braided member 30 can be easily attached to the tubular portion 510.

As shown in FIG. 2, the end on the other side of the shielding braided member 30 is connected to a shell 53. The shell 53 is a conductive member that is connected to the sheathing pipe 22 such that electric conduction is established. The shell 53 is formed in a tubular shape such that the plurality of electric wires 90 can be inserted thereinto. The outside of the shell 53 is sheathed with the end on the other side of the shielding braided member 30, and, in this state, the end on the other side of the shielding braided member 30 is crimped and fixed thereto using a crimp fixing portion 35 including a crimp ring 351 and a crimp ring 353. Specifically, the metal braided portion 31 at the end on the other side of the shielding braided member 30 is crimped with the crimp ring 351 and fixed. Moreover, the mixed braided portion containing the resin wires 303 other than the metal braided portion 31 is crimped with the crimp ring 353 and fixed.

The metal braided portion 31 containing no resin wires 303 is also connected to the shell 53 at the end on the other side of the shielding braided member 30, and therefore, the reliability of the conductive connection between the shielding braided member 30 and the shell 53 can be increased. Furthermore, the mixed braided portion containing the resin wires 303 is also crimped and fixed using the crimp ring 353, and therefore, the end of the shielding braided member 30 can be firmly fixed to the shell 53. It should be noted that the shell 53 may be omitted, and the end on the other side of the shielding braided member 30 may be connected directly to the sheathing pipe 22.

The shielding braided member 30, the shells 51 and 53, and the crimp fixing portions 35 are examples of the components of a shielding structure for achieving electromagnetic shielding of the electric wires 90.

2. Second Embodiment

Next, a second embodiment will be described. It should be noted that the following description denotes elements having functions similar to those of the already described elements by the same reference numerals as the already described elements, with or without an alphabetical symbol added thereto, and may omit a detailed description of those elements.

Figure 4:
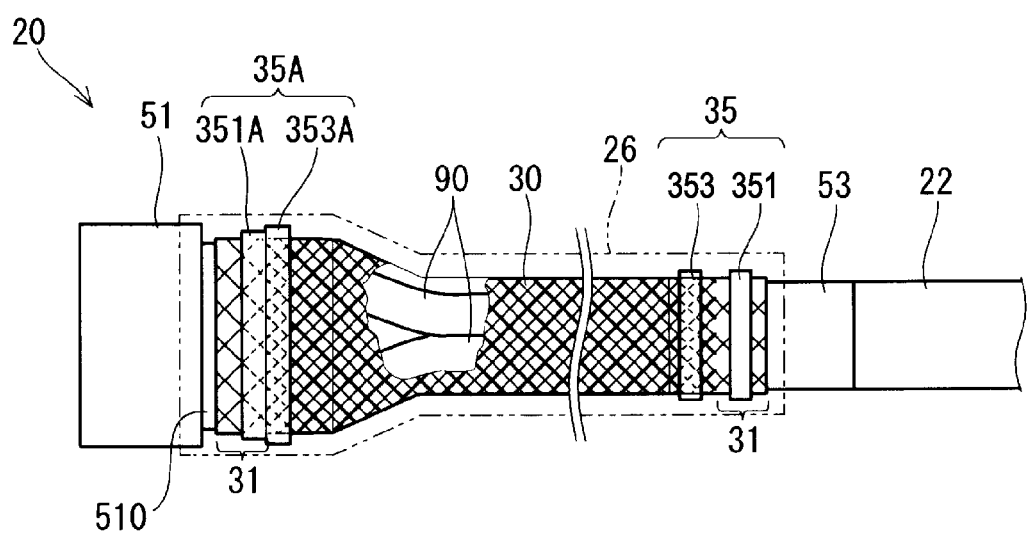
FIG. 4 is a schematic side view showing one end of a wiring module according to a second embodiment.

FIG. 4 is a schematic side view showing one end of a wiring module 20 according to the second embodiment. In the shielding structure of this embodiment, one end of the shielding braided member 30 is crimped and fixed to the shell 51 via a crimp fixing portion 35A. The crimp fixing portion 35A includes a single crimp ring, and is provided at a boundary between the metal braided portion 31 and the mixed braided portion adjacent to the metal braided portion 31 in the shielding braided member 30.

More specifically, the crimp fixing portion 35A includes a first crimp fixing portion 351A with which an end of the metal braided portion 31 is crimped and fixed, and a second crimp fixing portion 353A with which an end of the mixed braided portion adjacent to the metal braided portion 31 is crimped and fixed. Fixing an end of the shielding braided member 30 with the crimp fixing portion 35A, which is constituted by a single member, in this manner makes it possible to reduce the number of components of the shielding structure.

Here, the first crimp fixing portion 351A is crimped more strongly than the second crimp fixing portion 353A is. Therefore, the external dimension (diameter) of the first crimp fixing portion 351A is smaller than that of the second crimp fixing portion 353A, and a step is formed between the first crimp fixing portion 351A and the second crimp fixing portion 353A. Setting the crimping force of the first crimp fixing portion 351A to be larger than that of the second crimp fixing portion 353A in this manner makes it possible to crimp and fix the metal braided portion 31 more firmly than the mixed braided portion. Therefore, the reliability of the conductive connection between the shielding braided member 30 and the shell 51 can be further increased. It should be noted that the external dimension of the first crimp fixing portion 351A may be the same as that of the second crimp fixing portion 353A.

It should be noted that, although the description is omitted, an end on the other side of the shielding braided member 30 may also be crimped and fixed using a single member such as a crimp fixing portion 35A in the same manner as the end on the one side.

3. Modified Examples

Although the embodiments have been described above, the present invention is not limited to the above-described embodiments, and various modifications can be made.
Modified Example of Method of Forming Metal Braided Portion 31

For example, the method of forming the metal braided portion 31 is not limited to the above-described method using laser beam cutting. For example, the entire region in which the metal braided portion 31 is to be formed is heated to a predetermined temperature that is higher than or equal to the melting point of the resin wires 303 and is lower than or equal to the melting point of the metal wires 301 and thus dissolved, or immersed into a solution with which the resin wires 303 are specifically melted and thus dissolved. Then, the resin wires 303 may be removed by washing the dissolved substances away, for example, so that the metal braided portion 31 may be formed in the shielding braided member 30.

It is also conceivable as another method of forming the metal braided portion 31 that the mixed braided portion is formed by braiding the plurality of metal wires 301 and the plurality of resin wires 303 together, and then, only the plurality of metal wires 301 are subsequently braided, so that the metal braided portion 31 is formed.
Modified Example of Portion at which Metal Braided Portion 31 is Formed The metal braided portion 31 is not necessarily formed at an end of the shielding braided member 30, and may also be formed at the intermediate portion on the interior side. For example, an aspect is also possible in which the metal braided portion 31 formed at the intermediate portion of the shielding braided member 30 is crimped and fixed to a conductive member to establish ground connection.
Modified Example of Shape of Shielding Braided Member 30

In the above-described embodiments, the shielding braided member 30 has a tubular shape, and is arranged such that the entire outer circumferences of the electric wires 90 are sheathed with the shielding braided member 30. However, the shielding braided member 30 is not necessarily formed in a tubular shape. For example, an aspect is also possible in which a shielding braid is formed in a sheet-like shape, and this sheet-like shielding braid is arranged such that the electric wires 90 are shielded only in a specific direction.

Having described the present invention in detail, the foregoing description is illustrative in all aspects and the present invention is not limited thereto. It is understood that countless modified examples not illustrated herein are conceivable without deviating from the scope of the present invention. Moreover, the configurations described in the above-described embodiments and modified examples can be used together as appropriate as long as they are compatible with each other, or omitted.

The invention claimed is:

1. A shielding structure comprising:
   a shielding braided member that is obtained by braiding a plurality of resin wires and a plurality of conductive metal wires together and is arranged to achieve electromagnetic shielding of an electric wire;
   a conductive member that is connected to the shielding braided member; and
   a crimp fixing portion with which a portion of the shielding braided member is crimped and fixed to the conductive member such that electric conduction is established,
   wherein the shielding braided member includes a metal braided portion that contains no resin wires and that is formed by braiding the plurality of metal wires, and
   the metal braided portion in the shielding braided member is crimped and fixed to the conductive member using the crimp fixing portion.

2. The shielding structure according to claim 1,
   wherein the crimp fixing portion comprises:
   a first crimp fixing portion with which the metal braided portion in the shielding braided member is fixed to the conductive member; and
   a second crimp fixing portion with which a mixed braided portion containing the resin wires other than the metal braided portion in the shielding braided member is fixed to the conductive member.

3. The shielding structure according to claim 2, wherein the crimp fixing portion is constituted by a single member including the first crimp fixing portion and the second crimp fixing portion.

4. The shielding structure according to claim 2, wherein a crimping force of the first crimp fixing portion is larger than that of the second crimp fixing portion.

5. The shielding structure according to claim 1, wherein the metal braided portion is formed at an end of the shielding braided member.

6. The shielding structure according to claim 5, wherein the shielding braided member has a tubular shape and forms an insertion path into which the electric wire is inserted,
the conductive member includes a tubular portion that is arranged inside the metal braided portion at the end of the shielding braided member, and
the crimp fixing portion includes an annular member with which the metal braided portion at the end of the shielding braided member is crimped and fixed to the tubular portion of the conductive member.

7. A shielding braided member formed by braiding a plurality of resin wires and a plurality of conductive metal wires together, the shielding braided member comprising:
a metal braided portion that contains no resin wires and that is formed by braiding the plurality of metal wires together.

8. The shielding structure according to claim 3, wherein a crimping force of the first crimp fixing portion is larger than that of the second crimp fixing portion.

9. The shielding structure according to claim 2, wherein the metal braided portion is formed at an end of the shielding braided member.

10. The shielding structure according to claim 3, wherein the metal braided portion is formed at an end of the shielding braided member.

11. The shielding structure according to claim 4, wherein the metal braided portion is formed at an end of the shielding braided member.

* * * * *